US007777393B2

(12) United States Patent
Puskas

(10) Patent No.: US 7,777,393 B2
(45) Date of Patent: Aug. 17, 2010

(54) ULTRASOUND SYSTEM

(76) Inventor: William L. Puskas, P.O. Box 1676, New London, NH (US) 03257-1676

( * ) Notice: Subject to any disclaimer, the term of this patent is extended or adjusted under 35 U.S.C. 154(b) by 0 days.

(21) Appl. No.: 12/386,909

(22) Filed: Apr. 24, 2009

(65) Prior Publication Data

US 2009/0248364 A1 Oct. 1, 2009

Related U.S. Application Data

(62) Division of application No. 11/827,288, filed on Jul. 11, 2007, now Pat. No. 7,629,726.

(51) Int. Cl.
*H01L 41/08* (2006.01)

(52) U.S. Cl. ................................ 310/316.01; 310/317

(58) Field of Classification Search ......... 318/116-118; 310/316.01, 31
See application file for complete search history.

(56) References Cited

U.S. PATENT DOCUMENTS

| | | | | |
|---|---|---|---|---|
| 4,554,477 | A | 11/1985 | Ratcliff | |
| 4,588,917 | A | 5/1986 | Ratcliff | |
| 4,663,977 | A * | 5/1987 | Vander Heyden | 73/861.27 |
| 4,736,130 | A | 4/1988 | Puskas | |
| 5,465,082 | A * | 11/1995 | Chaco | 340/825.49 |
| 6,019,852 | A | 2/2000 | Pedziwiatr et al. | |
| 6,273,100 | B1 | 8/2001 | Andreas et al. | |
| 6,308,369 | B1 | 10/2001 | Garcia et al. | |
| 6,433,460 | B1 | 8/2002 | Puskas | |
| 7,135,807 | B2 | 11/2006 | Min et al. | |
| 7,514,844 | B2 | 4/2009 | Unkrich | |
| 7,629,726 | B2 * | 12/2009 | Puskas | 310/316.01 |
| 2005/0017599 | A1 | 1/2005 | Puskas | |
| 2008/0129146 | A1 * | 6/2008 | Puskas | 310/317 |
| 2009/0015096 | A1 * | 1/2009 | Puskas | 310/317 |
| 2009/0241986 | A1 * | 10/2009 | Puskas | 134/1 |
| 2009/0248364 | A1 * | 10/2009 | Puskas | 702/185 |
| 2009/0264754 | A1 * | 10/2009 | Dahl et al. | 600/438 |

FOREIGN PATENT DOCUMENTS

| | | | |
|---|---|---|---|
| KR | 10-2002-0068455 | A | 8/2002 |
| KR | 10-2007-0044383 | A | 4/2007 |

* cited by examiner

*Primary Examiner*—Mark Budd
(74) *Attorney, Agent, or Firm*—Phillips Lytle LLP

(57) ABSTRACT

An ultrasound system for providing megasonics and ultrasonics to a liquid at different frequencies and/or sweeping frequencies with associated generators, transducers, operations between resonance and anti-resonance, non-resistive output with phase shift, multiple/sweep/single frequency modes, individually controlled sections, gate drive power control, variable inductive compensation for temperature changes, parallel inductor matching, stacked ceramics and non-volatile memory storage of fault, error and failure history.

14 Claims, 10 Drawing Sheets

ULTRASOUND SYSTEM

CROSS-REFERENCE TO RELATED APPLICATIONS

This application is a division of commonly owned U.S. patent application Ser. No. 11/827,288, filed Jul. 11, 2007 now U.S. Pat. No. 7,629,726. The entire contents of such application is incorporated herein by reference.

TECHNICAL FIELD

The present invention relates to megasonic and ultrasonic systems, and more particularly to systems for generating high power megasonic sound energy and introducing the megasonic sound energy into liquid media for the purpose of cleaning and/or processing.

BACKGROUND ART

For years, megasonic energy has been used in manufacturing and processing plants to clean and/or otherwise process objects within liquids. It is well known that objects may be efficiently cleaned or processed by immersion in a liquid and subsequent application of megasonic energy to the liquid. Prior art megasonic systems include transducers, built by bonding piezoelectric ceramics to radiating membranes such as quartz, sapphire, stainless steel, titanium, tantalum, boron nitride, silicon carbide, silicon nitride, aluminum and ceramics, and generators designed to stimulate the transducers at a resonant or antiresonant frequency. The transducers are mechanically coupled to a tank containing a liquid that is formulated to clean or process the object of interest. The amount of liquid is adjusted to partially or completely cover the object in the tank, depending upon the particular application. When the transducers are stimulated by the output signal from the generator to spatially oscillate, they transmit megasonics into the liquid, and hence to the object. The interaction between the megasonic-energized liquid and the object creates the desired cleaning or processing action.

However, prior art megasonic systems lack optimum performance, are expensive and sometimes cause damage to the parts being cleaned or processed. The present invention improves performance of megasonic systems, reduces cost and minimizes damage caused by intense megasonic sound energy.

DISCLOSURE OF THE INVENTION

As used herein, megasonics means sound energy with a fundamental frequency from about 350 kHz to about 15 MHz. As used herein, ultrasonics means sound energy with a fundamental frequency from about 18 kHz to about 350 kHz. The term ultrasound as used herein is defined to mean the complete range of ultrasonic and megasonic frequencies, from about 18 kHz to about 15 MHz.

With parenthetical reference to the corresponding parts, portions or surfaces of the disclosed embodiment, merely for the purposes of illustration and not by way of limitation, the present invention provides an improved megasonic system (2) for coupling megasonics to a liquid, comprising a megasonic transducer assembly of two or more megasonic transducers (10) having a first piezoelectric ceramic (11) bonded to a second piezoelectric ceramic (12), a megasonic generator (9) having a phase shift network (32) and an electronic bridge circuit (31) configured to selectively produce at least a first frequency of operation (64) and a second frequency of operation (67) and to selectively produce a driver signal characterized by a first frequency within a first frequency band (69) and to selectively produce a second frequency within a second frequency band (70) that is different from and non-contiguous to the first frequency band, the bridge circuit and phase shift network configured to provide an output voltage (36) and an output current (37), wherein the output voltage leads the output current by an angle (46) that is greater than 0 degrees and less than about 90 degrees into the phase shift network, the phase shift network having a non-resistive output circuit (100) having a Norton equivalent impedance (122) near infinity at the first frequency of operation, a transmission line (115) connecting the transducer assembly to the megasonic generator, at least one parallel inductor matching network (88) between the transmission line and the transducer assembly, at least one sensor (3) adapted to sense operating conditions of the megasonic system, a processor (4) communicating with the sensor, non-volatile memory (5) coupled to the processor, and the processor programmed to receive a signal from the sensor during operation of the megasonic system and to store the signal in the memory for access after operation of the megasonic system when the signal indicates a system error, fault or failure.

In another aspect, the invention also provides a megasonic transducer (10) comprising a first piezoelectric ceramic (11) with a positive polarity surface and a negative polarity surface opposite the positive surface, a second piezoelectric ceramic (12) with a positive polarity surface and a negative polarity surface opposite the positive surface, a resonator plate (15) having a first surface configured to couple megasonics to a liquid and a second surface, the negative polarity surface of the first piezoelectric ceramic bonded to the positive polarity surface of the second piezoelectric ceramic to form a megasonic piezoelectric assembly (14), and the negative polarity surface of the second piezoelectric ceramic bonded to the second surface of the resonator plate to form a megasonic transducer for producing multiple megasonic frequencies.

The invention also provides a megasonic transducer comprising a first piezoelectric ceramic having a positive polarity surface and a negative polarity surface opposite the positive surface, a second piezoelectric ceramic having a positive polarity surface and a negative polarity surface opposite the positive surface, a resonator plate having a first surface configured to couple megasonics to a liquid and having a second surface, the positive polarity surface of the first piezoelectric ceramic bonded to the negative polarity surface of the second piezoelectric ceramic to form a megasonic piezoelectric assembly, and the positive polarity surface of the second piezoelectric ceramic bonded to the second surface of the resonator plate to form a megasonic transducer for producing multiple megasonic frequencies.

The invention also provides an ultrasound system (30) comprising an electronic bridge circuit (31) that provides an operational frequency or operational bandwidth of frequencies and has a first output terminal (35) and a second output terminal (34) configured to provide an output voltage (36) and an output current (37), a phase shift network (32) having a first input terminal (38), a second input terminal (39), a first output terminal (40) and a second output terminal (41), the first output terminal of the bridge circuit coupled to the first input terminal of the phase shift network and the second output terminal of the bridge circuit coupled to the second input terminal of the phase shift network, an ultrasound transducer (33) having a first input terminal (42) and a second input terminal (43), the first output terminal of the phase shift network coupled to the first input terminal of the transducer and the second output terminal of the phase shift network coupled to the second input terminal of the transducer, the bridge circuit, the phase shift network and the transducer configured such that the output voltage leads the output current by an angle (46) that is greater than 0 degrees and less than about 90 degrees for the operational frequency or bandwidth of frequencies.

The operational bandwidth of frequencies may be the frequencies over which the transducer sweeps (69, 70). The electronic bridge circuit may comprise a loop inductance (50, 53) of between about 3 nanohenrys and about 27 nanohenrys and at least one gate drive dead time (49, 52) of between about 97 nanoseconds and about 787 nanoseconds. The electronic bridge circuit may also comprise at least one power MOSFET transistor as a switching device. The output voltage may lead the output current by an angle that is greater in a middle region of the operational bandwidth of frequencies than an angle at an end region of the operational bandwidth of frequencies and the output voltage may lead the output current by an angle that varies as a function g(f) of the frequency over the operational bandwidth of frequencies to produce a specified function h(f) for power versus frequency over the operational bandwidth of frequencies. The system may further comprise a phase lock loop (79, 80) controlling the operational bandwidth of frequencies. The transducer may be a megasonic transducer assembly.

The invention also provides a method of delivering multiple megasonic frequencies to a liquid, comprising the steps of (a) providing a liquid, (b) providing a megasonic transducer or assembly of megasonic transducers configured to selectively produce megasonic energy in the liquid at a first frequency (64) within a first frequency band (69) and at a second frequency (67) within a second frequency band (70) that is different from and non-contiguous to the first frequency band, (c) coupling the transducer to the liquid and (d) driving the transducer with a megasonics generator (9) configured to produce the first frequency and the second frequency.

The transducer may be configured to selectively produce megasonic energy in the liquid at sweeping frequencies within the first frequency band and may be configured to selectively produce megasonic energy in the liquid at sweeping frequencies within the second frequency band. The megasonic generator may be configured to selectively produce the sweeping frequencies in the first frequency band and to produce the sweeping frequencies in the second frequency band.

The invention also provides a method of delivering multiple megasonic frequencies to a liquid, comprising the steps of (a) providing a liquid, (b) providing a megasonic transducer or assembly of megasonic transducers configured to selectively produce megasonic energy in the liquid at a single frequency (64) within a first frequency band (69) and at sweeping frequencies in the first frequency band, (c) coupling the transducer to the liquid, and (d) driving the transducer with a megasonics generator (9) configured to produce the single frequency and the sweeping frequencies.

The invention also provides a megasonic system for coupling megasonics to a liquid, comprising a megasonic transducer adapted to couple to a liquid and configured and arranged so as to produce megasonics in the liquid at frequencies within at least a first frequency band and a second frequency band, a megasonic generator coupled to the transducer and configured and arranged to produce a driver signal to the megasonic transducer at one or more frequencies within each of the first and second frequency bands. The second frequency band may be different from and non-contiguous to the first frequency band. The transducer may comprise a first piezoelectric ceramic (11) with a positive polarity surface and a negative polarity surface opposite the positive surface, a second piezoelectric ceramic (12) with a positive polarity surface and a negative polarity surface opposite the positive surface, a resonator plate (15) having a first surface configured to couple megasonics to a liquid and a second surface, the negative polarity surface of the first piezoelectric ceramic bonded to the positive polarity surface of the second piezoelectric ceramic to form a megasonic piezoelectric assembly (14), and the negative polarity surface of the second piezoelectric ceramic bonded to the second surface of the resonator plate to form a megasonic transducer for producing multiple megasonic frequencies. The transducer may comprise a first piezoelectric ceramic having a positive polarity surface and a negative polarity surface opposite the positive surface, a second piezoelectric ceramic having a positive polarity surface and a negative polarity surface opposite the positive surface, a resonator plate having a first surface configured to couple megasonics to a liquid and having a second surface, the positive polarity surface of the first piezoelectric ceramic bonded to the negative polarity surface of the second piezoelectric ceramic to form a megasonic piezoelectric assembly, and the positive polarity surface of the second piezoelectric ceramic bonded to the second surface of the resonator plate to form a megasonic transducer for producing multiple megasonic frequencies. The transducer may have a resonance frequency and an anti-resonance frequency within the first frequency band, and the frequency within the first frequency band has a value that is greater than the resonance frequency and less than the anti-resonance frequency. The generator and transducer may be configured and arranged to produce sweeping frequencies within at least one of the frequency bands, and the frequency band may be the first frequency band, the transducer may have a resonance frequency and an anti-resonance frequency within the first frequency band, and the sweeping frequencies may be greater than the resonance frequency and less than the anti-resonance frequency.

The invention also provides a system for coupling megasonics to a liquid, comprising a megasonic transducer adapted to couple to a liquid and configured and arranged so as to produce megasonics in the liquid at a first frequency (64) within a first frequency band (69) and at sweeping frequencies in the first frequency band, a megasonic generator coupled to the transducer and configured and arranged to produce a driver signal to the megasonic transducer at the first frequency and at the sweeping frequencies. The predominant form of cavitation in the liquid may be stable cavitation when the megasonics is at the first frequency and the predominant form of cavitation in the liquid may be transient cavitation when the megasonics is at the sweeping frequencies. The transducer may have a resonance frequency and an anti-resonance frequency within the first frequency band, and the frequency within the first frequency band may have a value that is greater than the resonance frequency and less than the anti-resonance frequency. The transducer may have a resonance frequency and an anti-resonance frequency within the first frequency band, and the sweeping frequencies may be greater than the resonance frequency and less than the anti-resonance frequency.

The invention also provides a multiple frequency megasonic generator comprising an electronic bridge circuit (31) configured to selectively produce at least a first frequency of operation (64) and a second frequency of operation (67) and to selectively produce a driver signal characterized by a first frequency within a first frequency band (69) and to selectively produce a driver signal characterized by a second frequency within a second frequency band (70) that is different from and non-contiguous to the first frequency band, and a controller for generating the first frequency within the first frequency band during a first time period and for generating the second frequency within the second frequency band during a second time period different from and non-contiguous to the first time period. The bridge circuit may be a half bridge circuit. The electronic bridge circuit may be configured to selectively produce a driver signal characterized by sweeping frequencies within at least one of the frequency bands. The electronic bridge circuit may be configured to selectively produce a driver signal characterized by sweeping frequencies within the first frequency band and to selectively produce a driver signal characterized by sweeping frequencies within the second frequency band. The electronic bridge circuit (31) may have a first output terminal (35) and a second output terminal (34) configured to provide an output voltage (36) and an output current (37) and may further comprise a phase shift network (32) having a first input terminal (38), a second input terminal (39), a first output terminal (40), and a second output terminal (41), the first output terminal of the bridge circuit coupled to the first input terminal of the phase shift network and the second output terminal of the bridge circuit coupled to the second input terminal of the phase shift network, an ultrasound transducer (33) having an first input terminal (42) and a second input terminal (43), the first output terminal of the phase shift network coupled to the first input terminal of the transducer and the second output terminal of the phase shift network coupled to the second input terminal of the transducer, the bridge circuit, the phase shift network and the transducer configured such that the output voltage leads the output current by an angle (46) that is greater than 0 degrees and less than about 90 degrees for at least one of the frequencies. The transducer may be a megasonic transducer assembly. The electronic bridge circuit may comprise a loop inductance (50, 53) of between about 3 nanohenrys and about 27 nanohenrys; and at least one gate drive dead time (49, 52) of between about 97 nanoseconds and about 787 nanoseconds. The electronic bridge circuit may be configured to selectively produce a driver signal characterized by sweeping frequencies within at least one of the frequency bands and the output voltage leads the output current by an angle that is greater in a middle region of the sweeping frequencies than the angle at an end region of the sweeping frequencies. The output voltage may lead the output current by an angle (46) that is greater than 0 degrees and less than about 90 degrees for at least one of the frequency bands. The multiple frequency megasonic generator may further comprise a phase shift network having a non-resistive output circuit (100) with a Norton equivalent impedance (122) near infinity at the first frequency of operation. The multiple frequency megasonic generator may further comprise a transducer, a transmission line (115) between the transducer to the megasonic generator, and at least one parallel inductor matching network (88) between the transmission line and the transducer. The transducer may have a resonance frequency and an anti-resonance frequency within the first frequency band, and the frequency within the first frequency band may have a value that is greater than the resonance frequency and less than the anti-resonance frequency.

The invention also provides a method of delivering transient megasonic cavitation and stable megasonic cavitation to a liquid, comprising the steps of (a) providing a liquid, (b) providing a megasonic transducer or assembly of megasonic transducers configured to selectively produce megasonic energy in the liquid at single frequencies and at sweeping frequencies within a first frequency band (69), (c) coupling the transducer to the liquid, (d) driving the transducer with a megasonics generator (9) configured to produce substantially all of a range of frequencies within the frequency band, and (e) controlling the generator so as to produce megasonic sweeping frequencies that cause predominantly transient cavitation in the liquid during a first time period and so as to produce a megasonic frequency that causes predominantly stable cavitation during a second time period different from and non-contiguous to the first time period.

The invention also provides an ultrasound system comprising a generator for generating a driving signal to power an ultrasound transducer assembly, at least one sensor (3) adapted to sense operating conditions of the generator, a processor (4) communicating with the sensor, non-volatile memory (5) coupled to the processor, and the processor programmed to receive a signal from the sensor during operation of the generator and to store the signal in the memory for access after operation of the generator when the signal indicates a system error, fault or failure, whereby a history of the faults, errors or failures is available after the generator is powered down. The processor may be selected from a group consisting of digital integrated circuits, programmable logic controllers or computers commonly referred to as microprocessors, microcontrollers, CPUs, PICs, PLCs, PCs and microcomputers. The non-volatile memory may be selected from a group consisting of flash memory, EEPROM, magnetic memory and optical memory. The ultrasound transducer assembly may be configured and arranged to couple megasonics to liquid, to couple ultrasonics to liquid, to couple ultrasonics to solid, or to couple ultrasonics to a gas. The non-volatile memory may be RAM powered by a battery. The fault, error or failure may be selected from a group consisting of a low power line voltage condition, a high power line current draw, an over voltage power line condition, an over temperature condition, an over voltage ultrasound driving signal, an over current ultrasound driving signal, an under voltage ultrasound driving signal, an under current ultrasound driving signal, an unlocked PLL condition, an out of specification phase shift condition, an ultrasound drive frequency over a maximum limit, an ultrasound drive frequency under a minimum limit, an excessive reflected power condition, an open ultrasound transducer assembly, a shorted ultrasound transducer assembly, an ultrasound transducer assembly over a maximum capacitance value, an ultrasound transducer assembly under a minimum capacitance value, a high impedance ultrasound transducer assembly, a low impedance ultrasound transducer assembly, a missing interlock, incorrect output power, loss of closed loop output power control, a start up sequence error, an aborted start up sequence, and a shut down sequence error.

Thus, the general object of the invention is to provide a system for coupling megasonics with a liquid at multiple megasonic frequencies and/or sweeping frequencies.

Another object is to provide a transducer for megasonics at multiple frequencies and/or sweeping frequencies.

Another object is to provide a generator for driving at multiple megasonic frequencies and/or sweeping frequencies.

Another object is to provide a generator for driving between a resonance and anti-resonance frequency.

Another object is to provide an ultrasound generator having a phase shift network that provides voltage leading current.

Another object is to provide an inductor for compensating for changes in transducer capacitance.

Another object is to provide a system for individually controlling piezoelectric ceramic segments.

Another object is to provide an inductor matching network.

Another object is to provide a gate drive for power control.

Another object is to provide a system with near infinite output.

Another object is to provide a system having a transmission line with increased stability.

Another object is to provide an ultrasound generator system having non-volatile storage of fault, error and failure codes.

These and other objects and advantages will become apparent from the foregoing and ongoing written specification, the drawings and the appended claims.

DESCRIPTION OF THE PREFERRED EMBODIMENTS

Figures 1A, 1B, 1C:
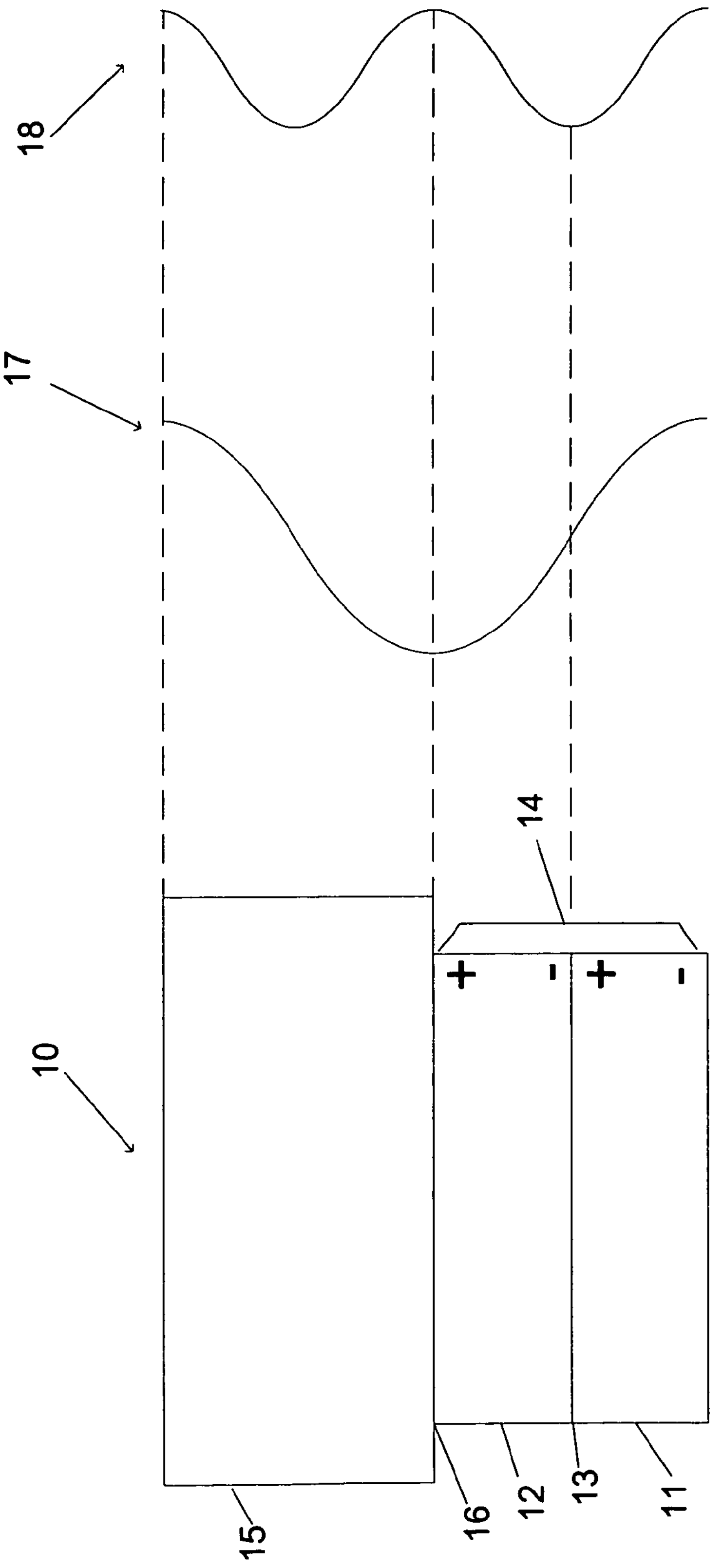
FIG. 1A shows the megasonic transducer used in the preferred embodiment shown in FIG. 12 consisting of two piezoelectric ceramics bonded together.
FIG. 1B shows a first resonant wave pattern for the megasonic transducer shown in FIG. 1A.
FIG. 1C shows a second resonant wave pattern for the megasonic transducer shown in FIG. 1A.

At the outset, it should be clearly understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, degree, etc.) together with the specification, and are to be considered a portion of the entire written description of this invention. As used in the following description, the terms “horizontal”, “vertical”, “left”, “right”, “up” and “down”, as well as adjectival and adverbial derivatives thereof (e.g., “horizontally”, “rightwardly”, “upwardly”, etc.), simply refer to the orientation of the illustrated structure as the particular drawing figure faces the reader. Similarly, the terms “inwardly” and “outwardly” generally refer to the orientation of a surface relative to its axis of elongation, or axis of rotation, as appropriate.

Figure 12:
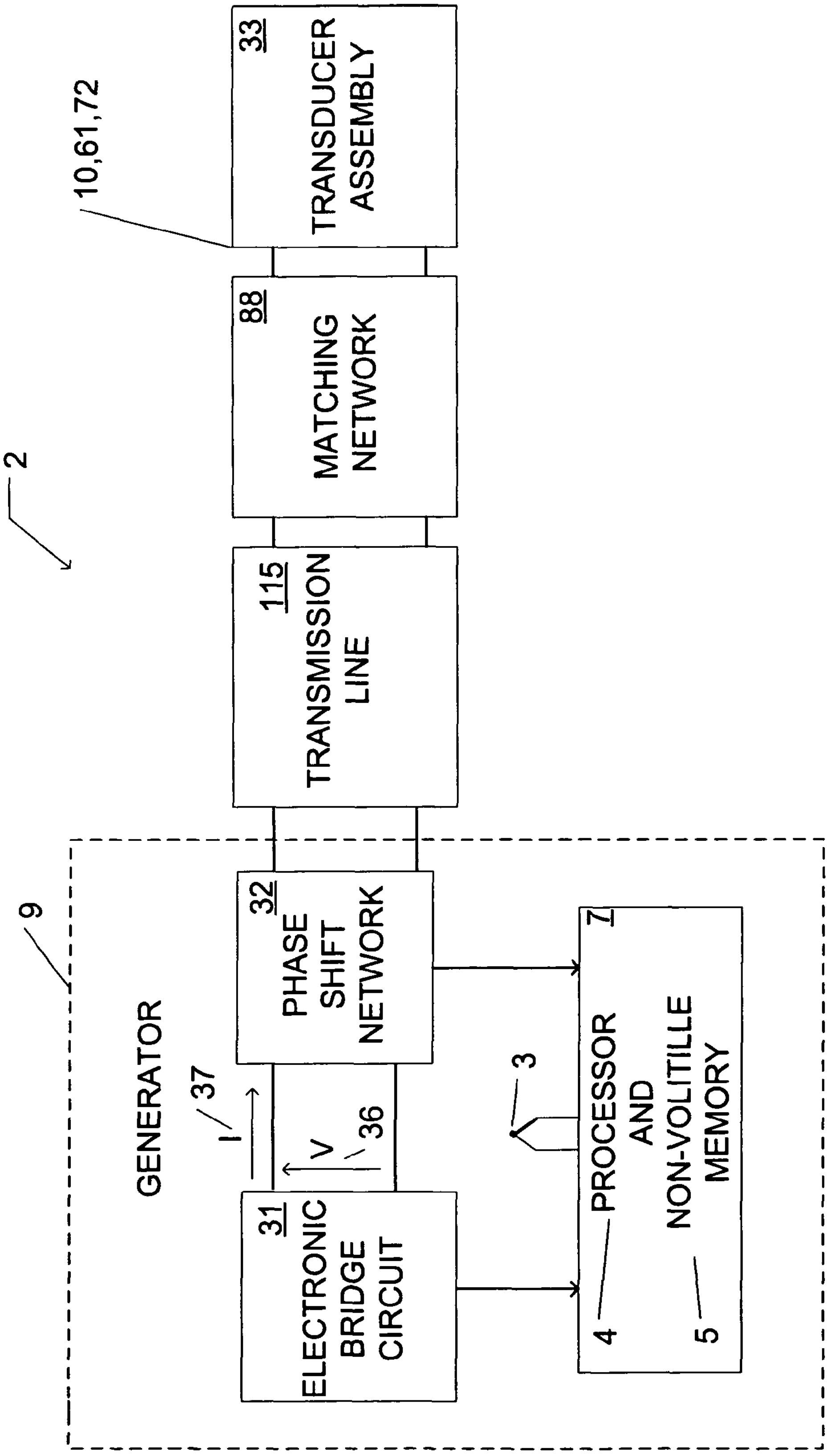
FIG. 12 shows in block diagram form a schematic of the preferred embodiment of the ultrasound system.

Referring now to the drawings and more particularly to FIG. 12, this invention provides an improved ultrasound system, of which the presently preferred embodiment is generally indicated at 2 and of which certain alternative embodiments are generally described below. The preferred embodiment 2 generally includes one or more megasonic generators 9 driving one or more megasonic transducers or assembles of transducers 33 (10, 61, 72). The transducers are in turn coupled to a liquid to clean or process a part or parts, or to perform a process on the liquid. The liquid may be contained within a tank, and the one or more transducers mount on or within the tank to impart ultrasound into the liquid. Alternatively, for megasonic transducers the liquid may be held between the megasonic transducer and the part such as by surface tension within a meniscus. In yet another form of coupling the megasonics to a liquid, a flowing stream may be employed, with the flowing liquid containing megasonics directed over the part or parts being cleaned or processed. This system is applicable to these and other configurations where megasonics is coupled or applied to liquid.

As further identified herein, this system is also applicable in certain embodiments to ultrasonics. For example, FIG. 12 shows a transducer assembly 33 which is referred to as a megasonic transducer 33, or a megasonic transducer assembly 33 when the disclosure is applicable to the frequency range 350 kHz to about 15 MHz. Assembly 33 will be referred to as an ultrasonic transducer 33, or an ultrasonic transducer assembly 33 when the disclosure is applicable to the frequency range 18 kHz to about 350 kHz. Assembly 33 will be referred to as an ultrasound transducer 33, a transducer assembly 33 or an ultrasound transducer assembly 33 when the disclosure is applicable to the frequency range 18 kHz to about 15 MHz. Although megasonic generators driving megasonic transducers are generally applicable to driving liquids, the lower frequency ultrasonic generators and ultrasonic transducers are generally applicable to driving solids, liquids and gasses. Examples of driving solids are ultrasonic plastic welding and ultrasonic wire bonding. Examples of driving liquids are ultrasonic cleaning, and photographic film emulsion degassing. An example of driving gasses is ultrasonic de-foaming equipment.

As shown in FIG. 1A, in the preferred embodiment transducer 10 comprises two or more piezoelectric ceramics bonded together and bonded to a radiating membrane. This configuration of multiple piezoelectric ceramics allows the transducer to operate at several harmonic or overtone frequencies that are spaced closer together than is possible with state of the art single ceramic megasonic transducers, thereby providing greater coverage of the megasonic frequency spectrum in multiple frequency megasonic systems.

With further reference to FIG. 1A, megasonic transducer 10 has two piezoelectric ceramics 11, 12 bonded together at bond line 13 forming piezoelectric assembly 14. Piezoelectric assembly 14 is bonded to resonator plate 15 at bond line 16. In the preferred embodiment, the polarity of the piezoelectric assembly is +−+− starting at piezoelectric ceramic 11. Thus, piezoelectric ceramic 11 with a positive polarity surface on the opposite sides thereof is bonded to a second piezoelectric ceramic 12 with a positive polarity surface and a negative polarity surface on opposite sides thereof. The negative polarity surface of the first piezoelectric ceramic 11 is bonded to the positive polarity surface of the second piezoelectric ceramic 12 forming the megasonic piezoelectric assembly 14. The negative polarity surface of the second piezoelectric ceramic 12 is bonded to the surface of the resonator plate 15 forming a megasonic transducer 10 capable of producing multiple megasonic frequencies. However, the polarity of each of the ceramics may be reversed to −+−+ (not shown).

FIG. 1B shows a resonant mode 17 of transducer 10 in FIG. 1A. This resonant mode 17 has a half wave in the piezoelectric assembly 14 and a second half wave in the resonator plate 15 of FIG. 1A. FIG. 1C shows another resonant mode 18 of transducer 10 in FIG. 1A. This resonant mode 18 has a full wavelength in the piezoelectric assembly 14 and a second full wavelength in the resonator plate 15 of FIG. 1A. Megasonic transducer 10 is therefore capable of producing a fundamental frequency and two times that fundamental frequency. This is an advantage over state of the art megasonic transducers, which are not able to produce frequencies this close together. The present state of the art megasonic transducers can produce a fundamental frequency and odd integer harmonics of the fundamental frequency. Accordingly, three times the fundamental frequency is the closest frequency that can be achieved with the present state of the art.

Megasonic transducers as are known in the art are driven at a resonance frequency or at an anti-resonance frequency. In contrast, in the preferred embodiment the megasonic transducers are driven at a frequency between resonance and anti-resonance. Further, when a megasonic transducer consists of multiple piezoelectric ceramic segments in parallel, as is practiced in the prior art, and these multiple piezoelectric ceramic segments in parallel are driven by a generator with a phase lock loop (PLL) used to maintain operation at the anti-resonant frequency, because of an averaging effect, conventional state of the art generators drive some of the piezoelectric ceramic segments at a frequency higher than the anti-resonant frequency. This causes lower performance operation of those segments. This lower performance operation is overcome in the preferred embodiment because all of the piezoelectric ceramic segments are driven between their individual resonant and anti-resonant frequencies.

For megasonic systems where the PLL locks on the anti-resonant, four techniques are provided that accomplish the improved performance of driving every piezoelectric ceramic segment in any transducer assembly at a frequency between its individual resonant and anti-resonant frequencies. The first technique uses a matching network at the piezoelectric ceramic segments to cause zero phase shift at a frequency lower than the anti-resonant frequency of the lowest frequency piezoelectric segment. The second technique uses a network in the output of the megasonic generator to cause zero phase shift at a frequency lower than the anti-resonant frequency of the lowest frequency piezoelectric segment. The third technique uses a PLL designed to lock onto a non-zero phase shift condition, in this case, a phase angle occurring between resonance and anti-resonance. The fourth technique delays the true voltage signal prior to sending it to the phase detector of the PLL so that when the PLL locks onto zero phase shift, it is maintaining a condition where the true voltage leads the current, which is the condition for operation between resonance and anti-resonance with a PLL designed to search for the anti-resonant frequency.

For megasonic systems where the PLL locks onto the resonant frequency rather than the anti-resonant frequency, the improvement of driving at a frequency between resonance and anti-resonance still applies. However, there are several implementation changes that must be made because when a PLL controlled megasonic generator is designed to operate at the anti-resonant frequency, the PLL searches toward lower frequencies when the output current leads the output voltage and the PLL searches toward higher frequencies when the output voltage leads the output current. The operation is reversed when a PLL controlled megasonic generator is designed to operate at the resonant frequency. The PLL searches toward higher frequencies when the output current leads the output voltage and the PLL searches toward lower frequencies when the output voltage leads the output current. Four techniques that accomplish the improved performance of driving every piezoelectric ceramic segment in a transducer assembly at a frequency between its individual resonant and anti-resonant frequencies for PLL search arrangements designed to lock onto the resonant frequency may be used.

The first technique uses a matching network at the piezoelectric ceramic segments to cause zero phase shift at a frequency higher than the resonant frequency of the highest frequency piezoelectric segment. The second technique uses a network in the output of the megasonic generator to cause zero phase shift at a frequency higher than the resonant frequency of the highest frequency piezoelectric segment. The third technique uses a PLL designed to lock onto a non-zero phase shift condition, in this case, a phase angle occurring between resonance and anti-resonance. The fourth technique shifts the true voltage signal back in time prior to sending it to the phase detector of the PLL so that when the PLL locks on zero phase shift, it is maintaining a condition where the true voltage leads the current, which is the condition for operation between resonance and anti-resonance with a PLL designed to search for the resonant frequency.

Figure 2A:
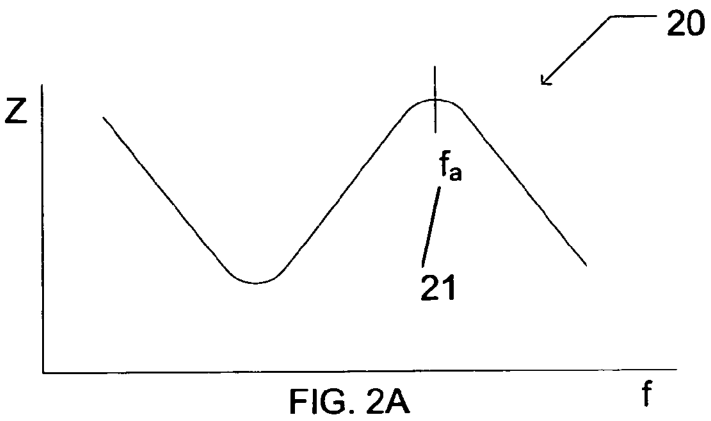
FIG. 2A shows an impedance plot for a prior art piezoelectric ceramic megasonic transducer and the operating frequency when driven at anti-resonance by a prior art PLL megasonic generator.

FIG. 2A shows an impedance plot 20 of a prior art piezoelectric ceramic megasonic transducer and the operating frequency 21 when driven at anti-resonance by a conventional state of the art phase lock loop (PLL) megasonic generator.

Figure 2B:
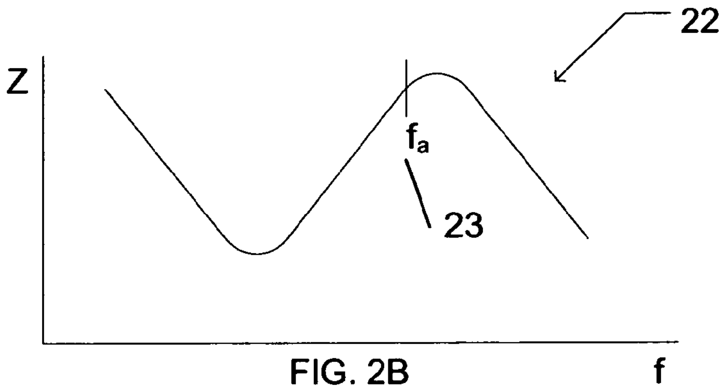
FIG. 2B shows an impedance plot for the piezoelectric ceramic megasonic transducer shown in FIG. 2A and the operating frequency when driven between resonance and anti-resonance by the megasonic generator shown in FIG. 12.
Figure 2C:
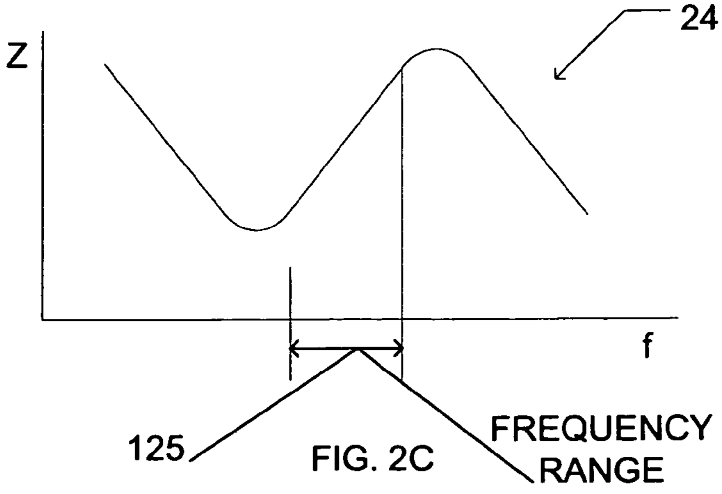
FIG. 2C shows an impedance plot for the piezoelectric ceramic megasonic transducer shown in FIG. 2A and the range of operating frequencies when driven between resonance and anti-resonance by the megasonic generator shown in FIG. 12.

FIG. 2B shows an impedance plot 22 for a piezoelectric ceramic megasonic transducer and the operating frequency 23 when driven between resonance and anti-resonance by the megasonic generator of the preferred embodiment. FIG. 2C shows an impedance plot 24 for a piezoelectric ceramic megasonic transducer and the range of operating frequencies 125 when driven between resonance and anti-resonance by the megasonic generator of the preferred embodiment.

Figure 3A:
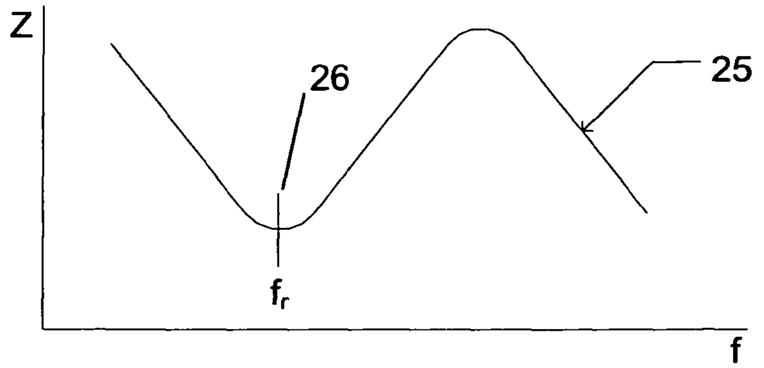
FIG. 3A shows an impedance plot for a prior art piezoelectric ceramic megasonic transducer and the operating frequency when driven at resonance by a prior art PLL megasonic generator.
Figure 3B:
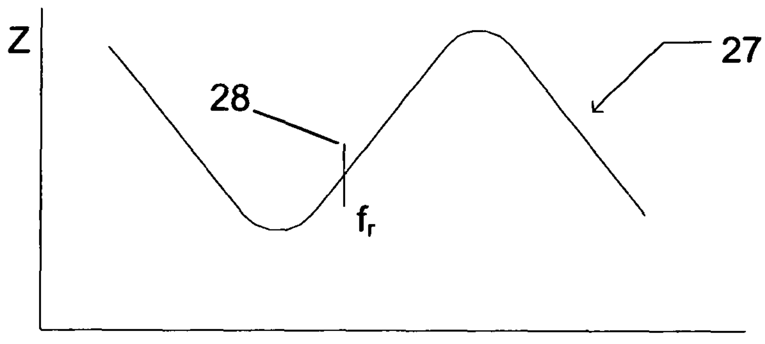
FIG. 3B shows an impedance plot for the piezoelectric ceramic megasonic transducer shown in FIG. 3A and the operating frequency when driven between resonance and anti-resonance by the megasonic generator shown in FIG. 12.
Figure 3C:
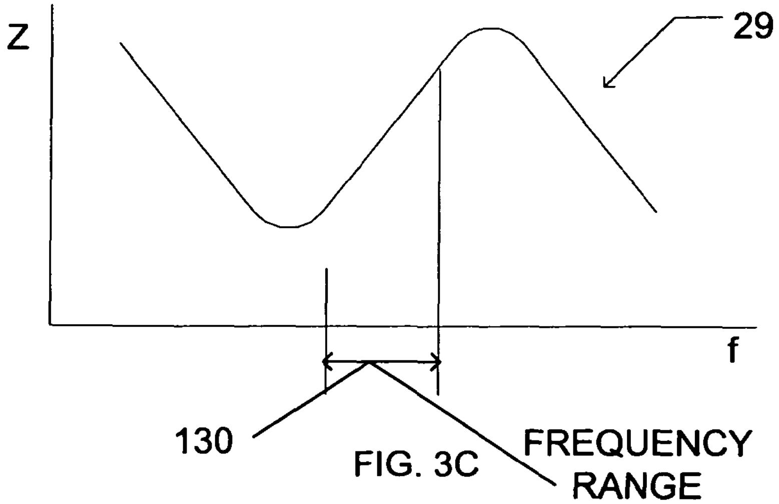
FIG. 3C shows an impedance plot for the piezoelectric ceramic megasonic transducer shown in FIG. 3A and the range of operating frequencies when driven between resonance and anti-resonance by the megasonic generator shown in FIG. 12.

FIG. 3A shows an impedance plot 25 of a prior art piezoelectric ceramic megasonic transducer and the operating frequency 26 when driven at resonance by a conventional state of the art PLL megasonic generator. FIG. 3B shows an impedance plot 27 for a piezoelectric ceramic megasonic transducer and the operating frequency 28 when driven between resonance and anti-resonance by the megasonic generator of the preferred embodiment. FIG. 3C shows an impedance plot 29 for a piezoelectric ceramic megasonic transducer and the range of operating frequencies 130 when driven between resonance and anti-resonance by the megasonic generator of the preferred embodiment.

In the first embodiment, a network 32 is placed between the electronic bridge circuit 31 (preferably a half bridge 48 or full bridge 51 topology) and the assembly of transducers 33 (preferably a transducer assembly that is a sweeping frequency or a transducer assembly that operates at various single frequencies within a PLL search bandwidth depending on the particular resonant frequency characteristics of the transducer assembly). The network is synthesized in combination with the transducer impedance characteristics such that the drive signal from the electronic bridge circuit always has the voltage leading the current by a phase angle between about one degree and about 89 degrees within the bandwidth of operation. This results in the simplest, least expensive, most reliable and most efficient sweeping frequency generator 9. A further improvement is to synthesize the network such that the magnitude of its phase shift is highest at the resonant frequency of the transducer assembly or in the middle region of the bandwidth of frequencies and decreases or approaches zero as the frequency sweeps to either end of the bandwidth. This adds a feature of a more constant power versus frequency over the sweep bandwidth. Data indicates that cleaning improves as the power versus frequency curve approaches a flat line. Although this network shows the greatest advantage at megasonic frequencies where losses are often higher than at lower ultrasonic frequencies, this phase shifting network is also applicable to other ultrasonic frequencies in the range from about 18 kHz up through the megasonic frequencies.

An electronic bridge circuit (a half bridge or full bridge topology) operates with current flowing forward through the switching devices and backwards through antiparallel or body diodes in parallel with the switching devices. When current through one of the diodes is reversed, the phase shift network in combination with the transducer impedance characteristics sets up a condition that the device that the diode is in parallel with is also on. This allows the reverse recovery current of the diode to flow with low voltage across the diode (i.e., the switching device on voltage). Therefore, there is insignificant power dissipation due to this reverse recovery current. Without the phase shift network in combination with the transducer impedance keeping the electronic bridge circuit output voltage leading the output current by an angle that is greater than 0 degrees and less than about 90 degrees, operational conditions occur where current through at least one of the diodes is reversed when the device that the diode is in parallel with is off. This causes the reverse recovery current of the diode to flow from the power supply voltage of the electronic bridge circuit to ground. Therefore, there is power dissipation due to this reverse recovery current equal to the power supply voltage times the reverse recovery current integrated and averaged over time. This power dissipation typically occurs every half cycle of the electronic bridge circuit resulting in significant power loss and inefficiency.

The preferred embodiment employs either a half bridge topology or a full bridge topology. An electronic bridge circuit 31 with an output supplying an output voltage 36 and an output current 37 and operational over a bandwidth of frequencies is provided. The electronic bridge circuit is coupled to a phase shift network 32 and the phase shift network is coupled to a transducer assembly 33. The electronic bridge circuit has output terminals from which the output voltage and the output current are supplied. The phase shift network has input terminals and output terminals, and the output terminals of the electronic bridge circuit are coupled to the input terminals of the phase shift network. The transducer assembly has input terminals, the output terminals of the phase shift network are coupled to the input terminals of the transducer assembly. The phase shift network coupled with the transducer assembly causes the output voltage of the electronic bridge circuit to lead the output current of the electronic bridge circuit by an angle greater than 0 degrees and less than about 90 degrees for all frequencies within the bandwidth of frequencies. An added enhancement to the operation of the electronic bridge circuit is to employ a loop inductance of between 3 nanohenrys and 27 nanohenrys and gate drive dead times between 97 nanoseconds and 787 nanoseconds to reduce spurious oscillations and to increase efficiency of the system.

The electronic bridge circuit with phase shift network and with transducer assembly can be used to produce a specific power curve versus frequency (P=h(f)) by synthesizing the phase shift network coupled with the transducer assembly such that the output voltage of the electronic bridge circuit leads the output current of the electronic bridge circuit by an angle that varies as a function of frequency g(f) over the bandwidth of frequencies to produce the specified function h(f) for the power versus frequency over the bandwidth of frequencies. The bandwidth of frequencies for the electronic bridge circuit are typically the set of lock frequencies for a phase lock loop which sets the system frequency or, if the system sweeps frequency, then the bandwidth of frequencies are the range of frequencies over which the system sweeps.

Figure 4A:
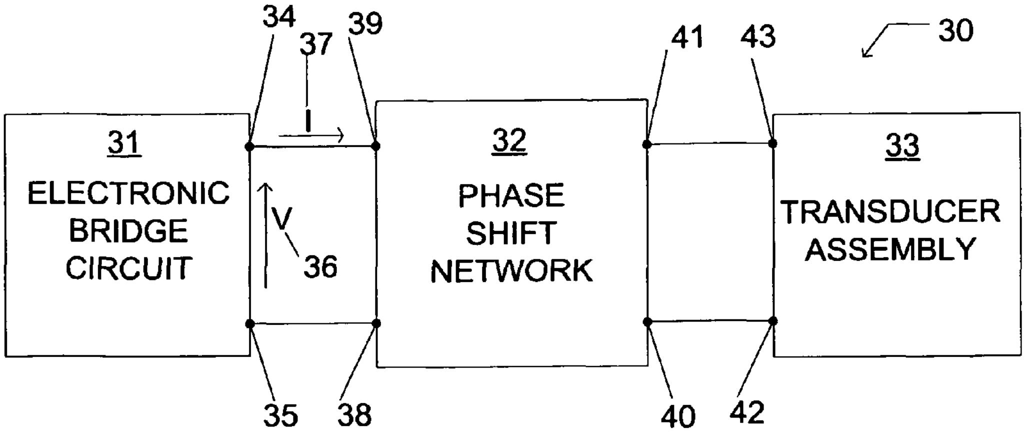
FIG. 4A shows in block diagram form the electronic bridge circuit, phase shift network and transducer assembly shown in FIG. 12.
Figure 4B:
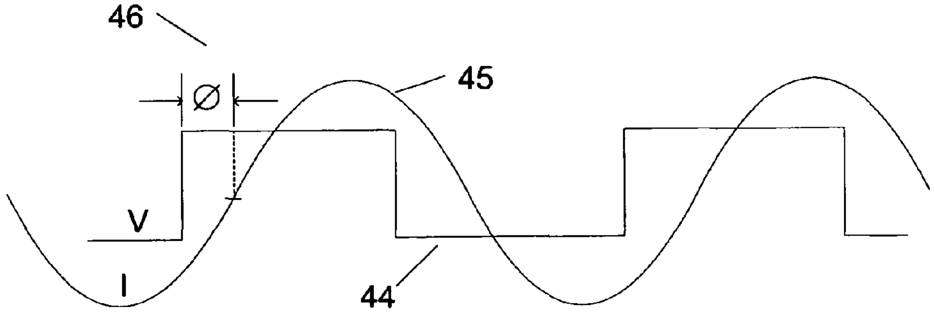
FIG. 4B shows waveforms of the output voltage and the output current from an electronic half bridge circuit of FIG. 4A.

FIG. 4A shows a block diagram of this preferred embodiment. As shown, system 30 generally includes an electronic bridge circuit 31, a phase shift network 32 and a transducer assembly 33. Electronic bridge circuit 31 is a conventional bridge circuit well known in the art. An example of an electronic half bridge circuit that may be used in the preferred embodiment is shown in FIG. 4D and an example of an electronic full bridge circuit that may be used in the preferred embodiment is shown in FIG. 4E. As shown in FIG. 4A, circuit 31 has an output at terminals 35 and 34. A voltage (V) 36 and a current (I) 37 is supplied from output terminals 35 and 34. The voltage 36 is typically square wave in shape, as shown in FIG. 4B, and the current 37 is typically sinusoidal in shape, as is shown in FIG. 4B.

As shown in FIG. 4A, the output terminals of electronic bridge circuit 31 are coupled to the input terminals 38 and 39 of phase shift network 32. While FIG. 4A shows this coupling to be a direct connection, other coupling techniques as are known in the art may be used. For example, the coupling might be through a transformer, such as a 1:1 isolation transformer, an auto transformer or a 1:N isolation transformer, where impedance transformations are desirable.

As shown in FIG. 4A, phase shift network 32 has output terminals 40 and 41 which are coupled to the input terminals 42 and 43, respectively, of ultrasound transducer assembly 33. While this coupling is shown in FIG. 4A to be a direct connection, other coupling techniques may be used as alternatives. For example, the coupling can be through a transformer, such as a 1:1 isolation transformer, an autotransformer, or a 1:N isolation transformer, where impedance transformations are desirable.

The phase of the voltage 36 and current 37 out of electronic bridge circuit 31 is determined by the impedance into terminals 38 and 39 of phase shift network 32. Since phase shift network 32 is coupled to ultrasound transducer assembly 33, the impedance into terminals 38 and 39 of phase shift network 32 is both a function of the phase shift network 32 impedance and the transducer assembly 33 impedance. This impedance into terminals 38 and 39 of phase shift network 32 is synthesized such that the voltage 36 leads the current 37 by a phase angle 46 of between about one degree and eighty nine degrees. FIG. 4B shows an example of this voltage-leading-current condition. As shown in FIG. 4B, the voltage 44 is shown to lead the current 45 by a phase angle 46 of Phi=20 degrees.

Figure 4C:
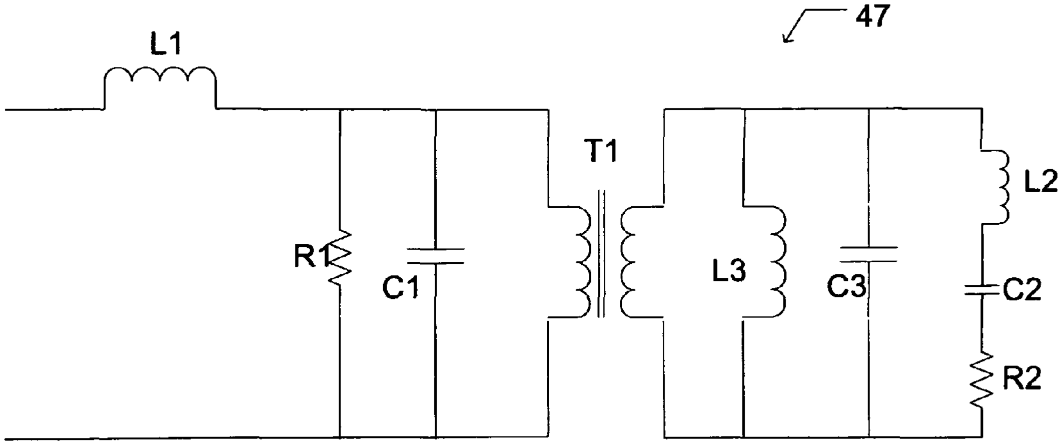
FIG. 4C shows a schematic of a phase shift network coupled to the transducer assembly shown in FIG. 12.
Figure 4D:
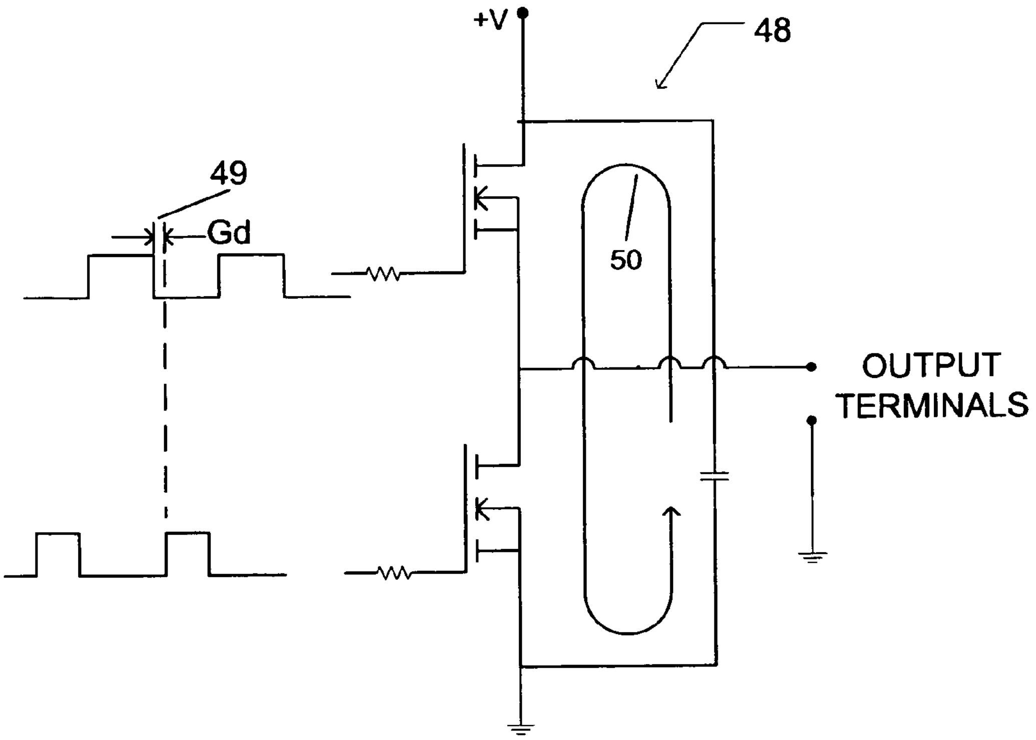
FIG. 4D shows a schematic of an electronic half bridge circuit with loop inductance and gate dead time.
Figure 4E:
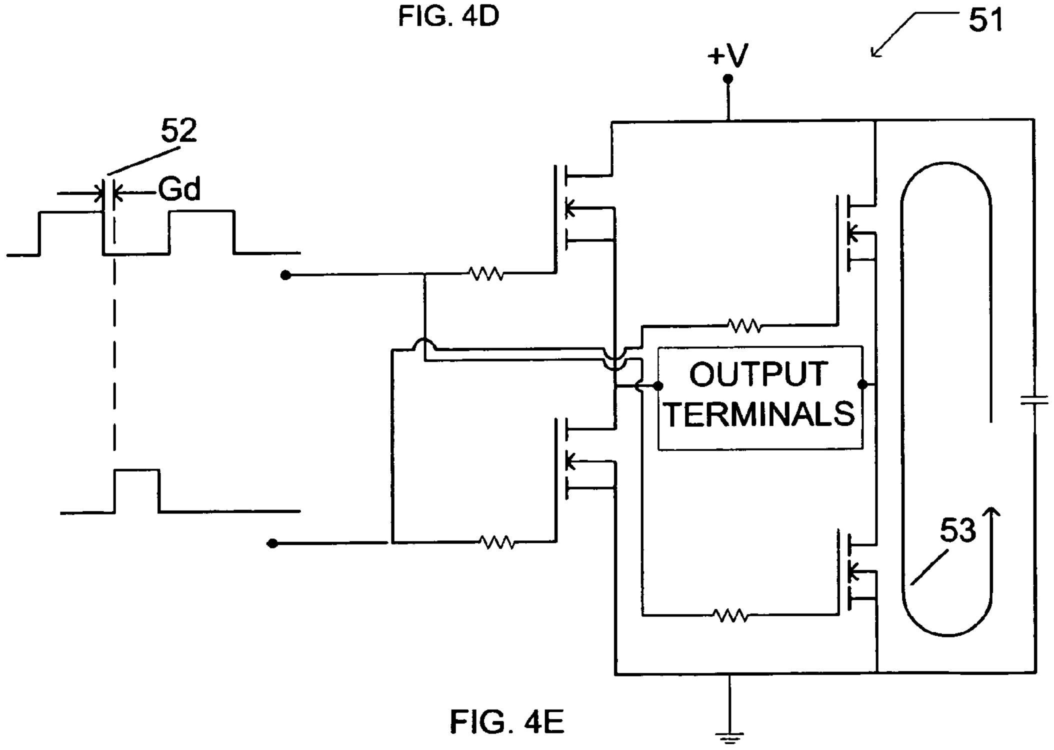
FIG. 4E shows a schematic of an electronic full bridge circuit with one loop inductance indicated and gate dead time.

FIG. 4C is a schematic diagram of the phase shift network 32 and transducer assembly 33 shown in FIG. 4A and having the characteristics shown in FIG. 4B. L1, R1 and C1 form the circuit for phase shift network 32. T1 couples phase shift network 32 to transducer assembly 33. L3 is typically an equivalent parallel inductance that is a function of transformer T1 not being an ideal transformer. C3, L2, C2, and R2 are the electrical equivalent circuit for transducer assembly 33. One skilled in the art can write the equations for the schematic shown in FIG. 4C and calculate or synthesize component values to provide the desired characteristics. A Hewlett Packard model 4194A Gain Phase Analyzer may be used for this purpose to tailor the phase curve by changing component values while observing the curve on the Hewlett Packard model 4194A Gain Phase Analyzer.

As mentioned above, FIG. 4D shows a schematic of an electronic half bridge circuit 48 of the type known in the art that may be used in the preferred embodiment as electronic bridge circuit 31. System 30 is enhanced in operation when the gate drive 49 dead times shown in FIG. 4D are between 97 nanoseconds and 787 nanoseconds while the loop 50 inductance is between 3 nanohenrys and 27 nanohenrys. The electronic full bridge circuit 51 shown in FIG. 4E may be used as an alternative embodiment of electronic bridge circuit 31. System 30 is again enhanced in operation when the gate drive Gd dead times 52 shown in FIG. 4E are between 97 nanoseconds and 787 nanoseconds while the loop 53 inductance is between 3 nanohenrys and 27 nanohenrys.

Figure 5:
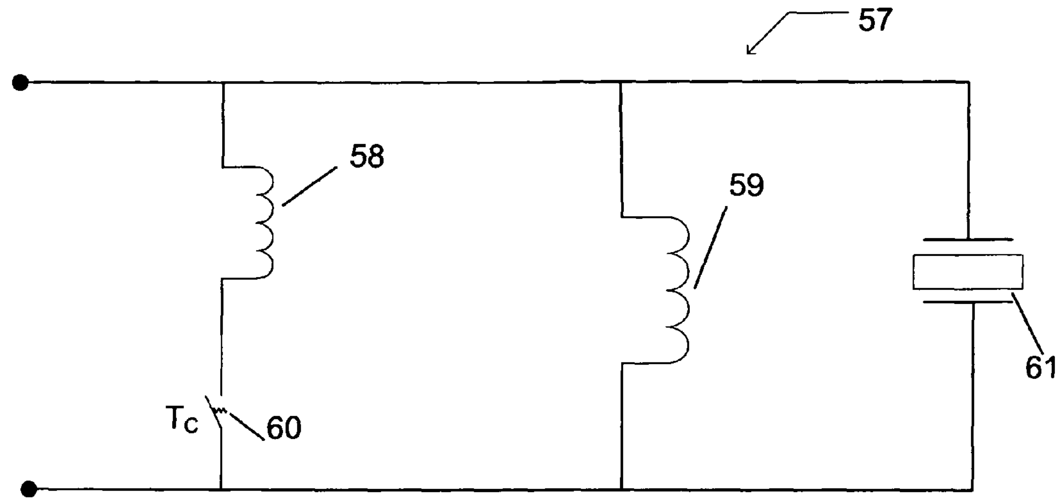
FIG. 5 shows a schematic of inductors used to compensate for changes in transducer capacitance.

In the preferred embodiment, shown in FIG. 5, at least one inductor 59 is mounted at or near megasonic transducer 61 or transducer assembly 61 and in parallel with the transducer or assembly 61. The inductor is responsive to the temperature of the transducer or assembly such that inductance decreases as transducer or assembly temperature increases. This can be a continual change or it can be a step change, implemented by an inductor 58 in series with a thermal switch 60. Decreasing the inductance in parallel with the transducer or assembly when temperature increases helps compensate for the increase in capacitance of the transducer or assembly. This compensation allows the megasonic system to operate over a larger temperature range within specifications than would otherwise be possible.

FIG. 5 is a schematic showing inductors 58 and 59 used to compensate for changes in transducer 61 capacitance. Tc 60 is a thermal switch that closes at a temperature below the maximum operating temperature that the system experiences. During operation at lower temperatures, inductor 59 compensates for capacitance of transducer 61. However, as temperature rises, the capacitance of transducer 61 increases and this increase must be compensated for to get optimum operation of system 2. At this increased temperature, Tc 60 closes, putting inductor 58 in parallel with transducer 61 and in parallel with inductor 59. This combination compensates to the original capacitance of transducer 61 near room temperature plus the increased capacitance of transducer 61 at increased operating temperatures.

The megasonic generator of the preferred embodiment is designed to be capable of switching between single frequency operation and sweeping frequency operation. Generator 9 produces a process that is superior to conventional state of the art processes because it allows two distinct cavitation characteristics to be employed in the cleaning or processing operation. For example, a multiple frequency megasonic system operating at a phase lock loop frequency of 950 kHz or a phase lock loop frequency of 2.85 MHz is provided to also sweep frequency in a bandwidth around 950 kHz and in a second bandwidth around 2.85 MHz. A delicate part with critical cleaning requirements may require transient cavitation to remove some of the contamination, but the typical transient cavitation existing in a conventional state of the art 1 MHz megasonic system is too harsh and does damage to the part. With this embodiment of generator 9, the mode of sweeping frequency around 2.85 MHz is used for gentle transient cavitation, followed by single frequency 950 kHz, and followed by single frequency 2.85 MHz to produce stable cavitation of sizes appropriate for submicron particle removal.

Figure 6:
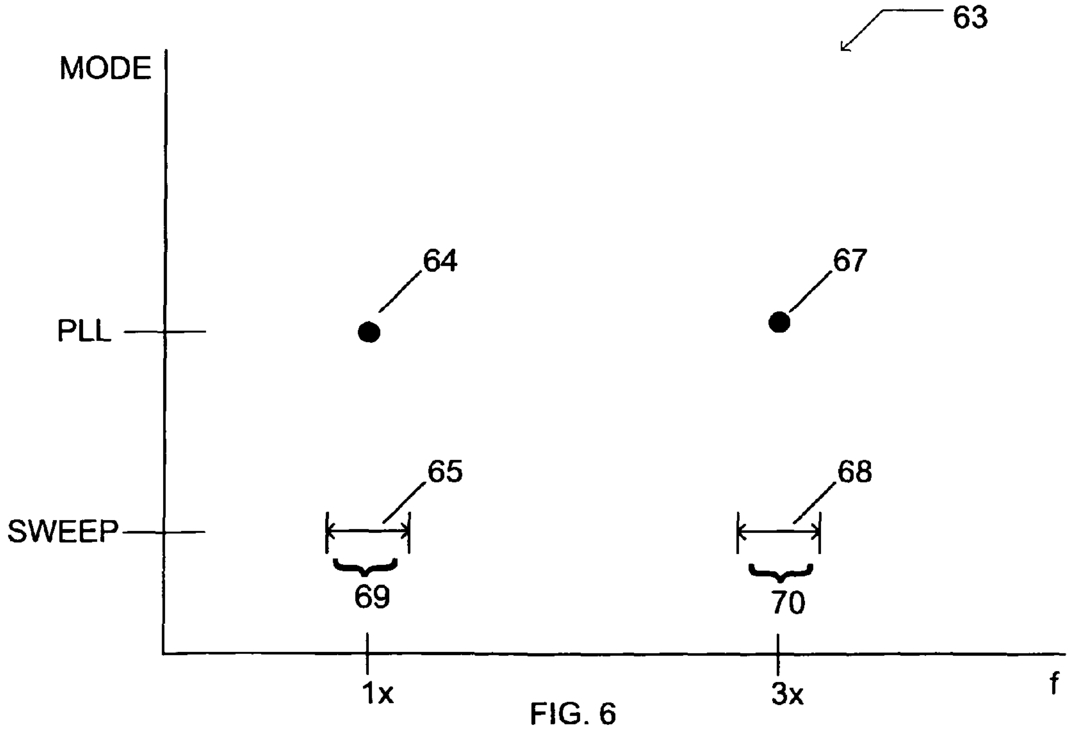
FIG. 6 shows a graph of the operating modes of a multiple frequency megasonic generator shown in FIG. 12 with both PLL single frequency output and sweep frequency output.

FIG. 6 shows a graph of the operating modes of a preferred embodiment of the multiple frequency megasonic generator 9 having both PLL single frequency output and sweep frequency output. Four modes of operation are shown in FIG. 6. Mode 64 is typical of state of the art megasonic systems where a single frequency is produced at a fundamental frequency of the megasonic transducer with a generator that is PLL controlled to lock onto an appropriate frequency, often a zero phase shift frequency called resonance (Fr) or anti-resonance (Fa). Mode 65 is new to the art of non Langevin type megasonic transducers and generators. Mode 65 sweeps frequency around a fundamental frequency over a bandwidth 69. Mode 67 is another new mode to the art of non Langevin type megasonic transducers and generators. In mode 67 a single frequency is produced at approximately three times the fundamental frequency of the megasonic transducer with a generator that is PLL controlled to lock onto this third overtone frequency. Mode 68 is also new to the art of non Langevin type megasonic transducers and generators. Mode 68 sweeps frequency around a frequency that is three times the fundamental frequency over a bandwidth of frequencies 70. Although the single frequency modes are achieved in the preferred embodiment by use of a closed loop PLL to maintain an optimum operating frequency, as an alternative, single frequencies may be produced with an open loop means such as with a stable oscillator. Each combination of modes shown in FIG. 6 a significant equipment and process improvement over conventional state of the art megasonic systems.

As mentioned above, one of the preferred combinations of modes possible with system 2 is a process in which mode 68 is performed first, followed by mode 64, followed by a final process step of mode 67. This process is advantageous because a delicate part with critical cleaning requirements may require transient cavitation to remove some of the contamination, but the typical transient cavitation existing in a state of the art megasonic system is too harsh and does damage to the part. With this method, mode 68 sweeps at the third overtone frequency 70, which produces gentle transient cavitation. Mode 68 is then followed by a single frequency at the fundamental frequency 64 and is then followed by a single frequency at the third overtone 67 to produce stable cavitation of sizes appropriate for submicron particle removal.

Another combination of modes not available in state of the art megasonic systems is a multiple frequency process consisting of different megasonic frequencies produced by the same megasonic transducer assembly. For example, with system 2 capable of producing mode 64 and mode 67, a process is provided that employs this multiple megasonic frequency operation. The advantage to this system and process over state of the art megasonic systems is that each different frequency removes a different particle size most effectively. Therefore, a larger range of contamination can be cleaned in a shorter time by this process and system.

Another combination of modes is a significant advance over state of the art megasonic systems. This combination of modes does not require the capability of multiple frequencies, but rather uses sweeping frequency for one time period in one megasonic frequency band around one megasonic frequency, followed by single frequency operation for a second time period at the megasonic frequency. For example, system 2 may produce mode 65 and mode 64. Another example is to produce mode 68 and mode 67.

For larger systems having the modes shown in FIG. 6, and where more than one multiple frequency megasonic generator drives more than one megasonic transducer assembly, two different modes can be produced concurrently. For example, with a two generator system, the two single frequency modes 64 and 67 can be operated at the same time, producing megasonics where half of the megasonic transducers are being driven at a low frequency (e.g., 1×) and where the other half of the megasonic transducers are being driven at a high frequency (e.g., 3×). Similar concurrent modes exist with different frequency sweeping frequency megasonics, such as modes 65 and 68 produced concurrently. Using system 2, other concurrent mode advantages may be produced.

In another embodiment, the megasonic generator is provided with multiple driver sections each with independent PLL (phase lock loop) and closed loop power control. Each of the multiple generator sections is configured and wired to drive one segment or section of piezoelectric ceramic transducer. This new system 83 gives the process engineer power control over each transducer segment or section while each segment or section is operating at an optimum closed loop frequency. The process engineer can then adjust each segment or section of a particular megasonic transducer for uniformity or for another specified power distribution curve that the process requires. The closed loop power control then maintains this condition for long term process optimization.

Figure 7:
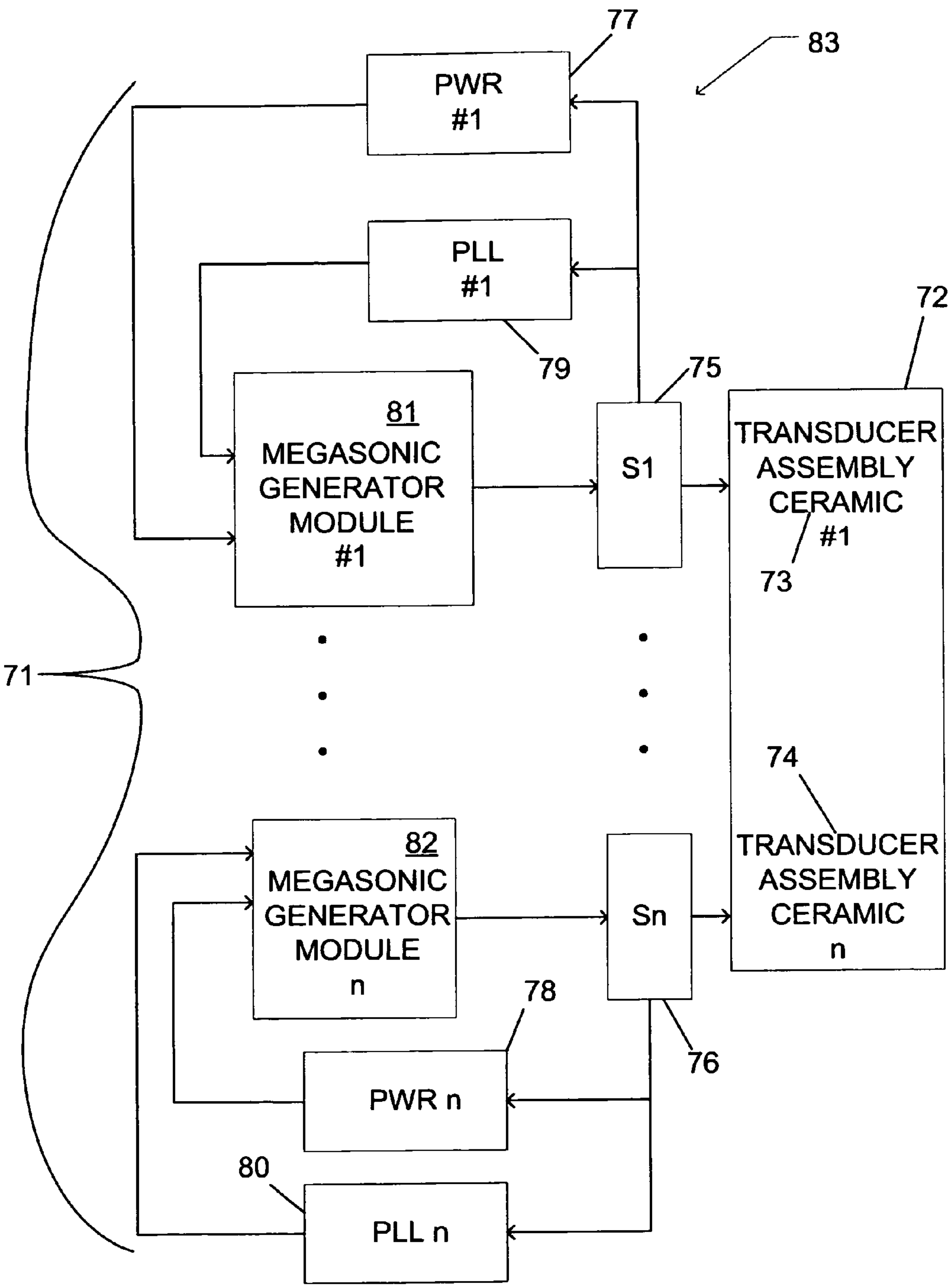
FIG. 7 shows in diagram form a generator and transducer assembly where each section has individual PLL frequency control and closed loop power control.

FIG. 7 is a diagram of system 83 and a generator 71 and transducer assembly 72 where each section has individual PLL frequency control and closed loop power control. One individual generator section 81 has an output sensing system 75 that detects the output voltage and output current waveforms. The power in these waveforms is calculated by system 77 and fed back to generator section 81 to complete a closed loop power control. The phase of the signals from sensing system 75 is detected by PLL #1 phase detector 79 and fed back to generator section 81 to close the loop for frequency control. This generator section 81, with a closed loop power control and a closed loop frequency control, drives one section 73 of transducer assembly 72.

The system shown in FIG. 7 also includes a n-th generator section 82 and transducer assembly section 74, where n-th section 82 has individual PLL frequency control and closed loop power control. The n-th individual generator section 82 has an output sensing system 76 that detects the output voltage and output current waveforms. The power in these waveforms is calculated by system 78 and fed back to generator section 82 to complete a closed loop power control. The phase of the signals from sensing system 76 is detected by PLL n phase detector 80 and fed back to generator section 82 to close the loop for frequency control. This generator section 82, with closed loop power control and closed loop frequency control, drives n-th section 74 of transducer assembly 72. This general section is duplicated as many times as necessary to give individual power control and frequency control to each section of a megasonic transducer assembly.

In the preferred embodiment, the generator 9, transducer 33 and transducer matching network 88 are configured for higher efficiency and lower cost than exists with state of the art megasonic systems. One conventional configuration is to connect the piezoelectric transducer to the generator through a cable. This is inefficient because the current flowing into and out of the capacitive component of the piezoelectric transducer causes heating of the cable and power loss. Another present day configuration is to use a transformer and reactive components at a piezoelectric megasonic transducer to match the impedance of the piezoelectric megasonic transducer to a coax cable impedance, typically 50 ohms. A coax cable of the proper impedance (typically 50 ohm RG-58 type coax cable) is used to connect this matched piezoelectric megasonic transducer to the generator. This is expensive because the matching transformer at megasonic frequencies is costly.

In the preferred embodiment, an inductor 89 (with a value in the range PI/(w^2*Co) to 1/(w^2*Co), where PI=3.14159, w=2PIf, Co is the parallel capacitance of the piezoelectric transducer, and f is the frequency of operation) is connected in parallel with the piezoelectric transducer at the transducer and uses any cable 115 to connect this assembly to the generator. The generator has a LC output network 100 which drives this cable, inductor 89 and piezoelectric transducer 33.

The cost reduction of a single inductor 89 versus a matching transformer 86 network 85 (prior art shown in FIG. 8A) is significant and efficiencies are gained by the parallel inductor 89 reducing the cable current. A third advantage of using a parallel inductor 89 across a piezoelectric megasonic transducer, rather than the more complex and expensive 50 ohm match 85 as is know in the art, occurs with sweeping megasonic systems. The 50 ohm match 85 is 50 ohms at only one frequency. However, with a sweeping frequency system the piezoelectric megasonic transducer is driven at many different frequencies making the characteristics of the parallel inductance 89 more consistent and superior over the full range of different frequencies.

Figure 8A:
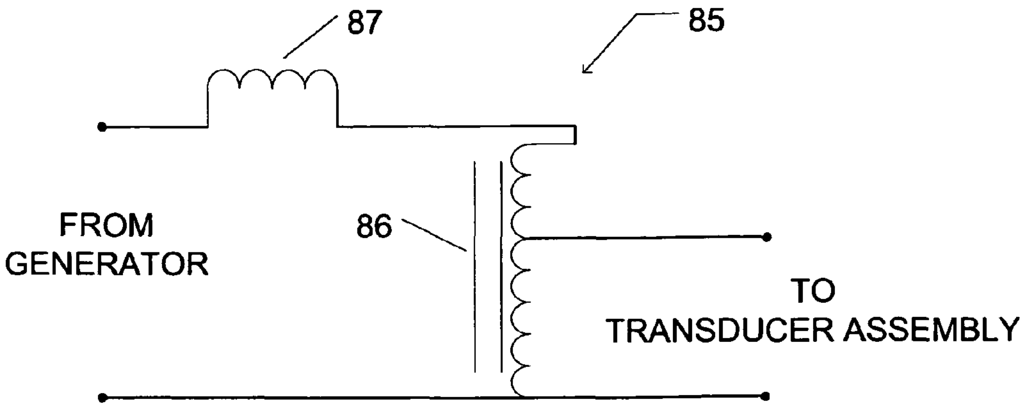
FIG. 8A shows a schematic of a prior art matching network.

FIG. 8A shows a schematic of a prior art matching network 85. Transformer 86 is used to transform the impedance of a megasonic transducer and inductor 87 is typically needed to add positive phase shift to the phase shift curve to get a zero cross for a PLL lock.

Figure 8B:
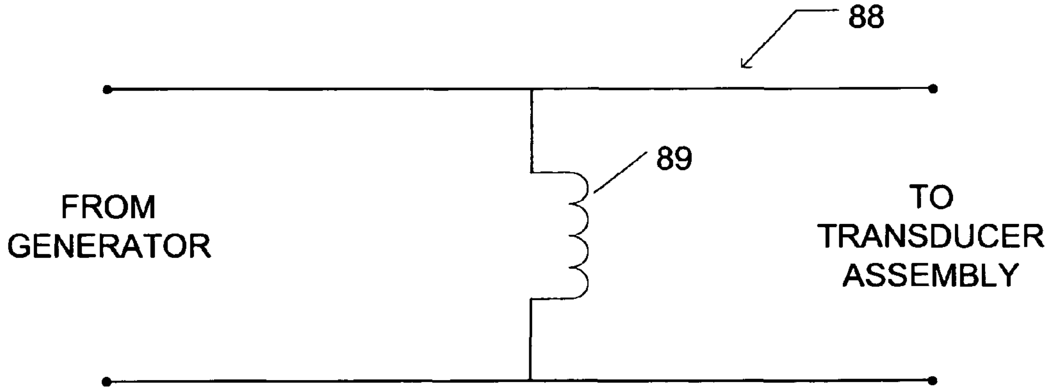
FIG. 8B shows a schematic of the matching network shown in FIG. 12.

FIG. 8B shows an improved and greatly simplified matching network 88. A single parallel inductor 89, having a value calculated from f=1/(2*PI*square root (L*Co)), gives a match where the PLL of the preferred embodiment generator can lock onto and drive the associated megasonic transducer assembly. In the above equation, "PI"=3.14159, "L" is inductor 89 of FIG. 8B, "Co" is the electrical capacitance of the megasonic transducer assembly piezoelectric ceramics, and "f" is the frequency of operation.

In another embodiment, a gate drive (where the duty cycle is non constant and the float side gate drive is the inverted ground side gate drive with dead times added) waveform for a half bridge is provided that will improve operation during power control when using gate duty cycle for the power control function in a megasonic generator. It eliminates the 3*Fo voltage changes that occur at the center of the half bridge when power is reduced. This improved gate drive still had a deficiency in that is was possible to have a condition where a forward biased antiparallel diode in one side of the half bridge could be reverse biased when the switching device is turned on in the other side of the half bridge. This condition dissipates energy and this impulse of energy in the circuitry causes noise and oscillations. Although this condition is common in state of the art ultrasonic generators, as frequency is raised to the 1 MHz range, this dissipation becomes a rather large problem. In this embodiment, the narrow gate pulses in the float side of the half bridge that meter the power to the load are always started when the current flowing from the center of the half bridge is negative, i.e., current flowing toward the half bridge typically through the ground side switching device. This solves the problems and results in a power control system that is small and low cost.

Figure 9:
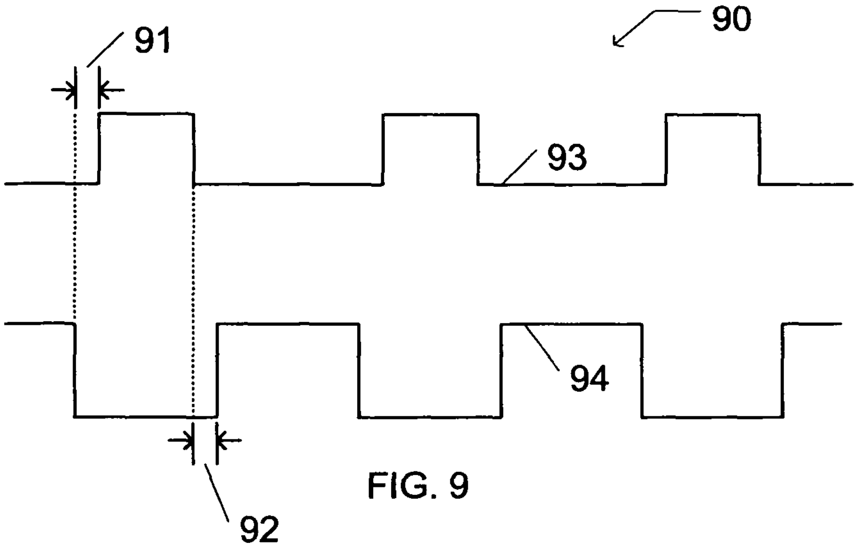
FIG. 9 shows the gate drive signals for improved half bridge operation with power control.

FIG. 9 shows gate drive signals 90 for improved half bridge operation with power control. Gate drive signal 93 would typically be connected to the gate of the float side switching device in an electronic half bridge circuit similar to that shown in FIG. 4D. Gate drive signal 94 would typically be connected to the gate of the ground side switching device in an electronic half bridge circuit similar to that shown in FIG. 4D. The gate drive signals 93 and 94 are an inverted form of each other except for the inserted dead times 91 and 92 in FIG. 9. In operation, the duty cycle of the float side gate drive 93 determines the power level out of the electronic half bridge circuit and the particular design of gate drive signal 94 with respect to gate drive signal 93 will improve operation when using this power control function in a megasonic generator. Again, it eliminates the 3*Fo voltage changes that occur at the center of the half bridge when power is reduced.

In another embodiment, the megasonic generator is designed and configured to have no resistive components or other lossy elements in the output stage. Unlike conventional state of the art megasonic generators where the output impedance matches the coax cable impedance, usually 50 ohms, this embodiment of the megasonic generator output stage does not have operating problems with mismatched loads or transducers because power reflected by the load or transducer is again reflected by the megasonic generator output stage back to the load or transducer. This results in a higher efficiency system when the transducer becomes mismatched due to temperature, age or other changes.

Figure 10:
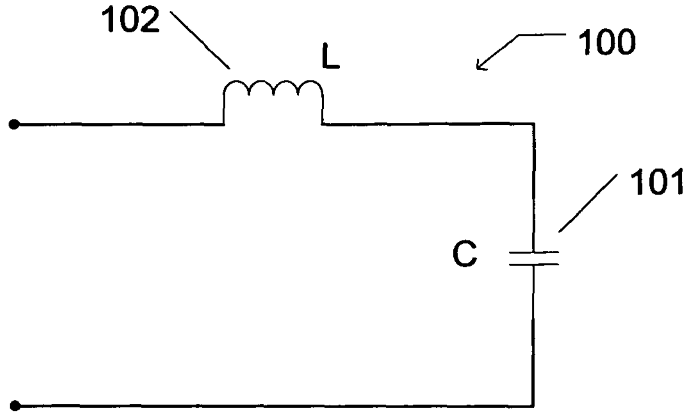
FIG. 10 shows a combination phase shift network and an output circuit with no resistive or other lossy elements for the generator shown in FIG. 12.

FIG. 10 shows the preferred embodiment of a generator output circuit 100 with no resistive or other lossy elements. The inductor 102 and the capacitor 101 are designed according to the formula f=1/(2*PI*square root (L*C)). "PI"=3.14159, "L" is the inductor 102 in FIG. 10, "C" is the capacitor 101 in FIG. 10, and "f" is the frequency of operation. Unlike conventional state of the art megasonic generators where the output impedance matches the coax cable impedance, when the megasonic generator is designed and configured to have no resistive components or other lossy elements in the output stage 100, the preferred embodiment of the megasonic generator output stage does not have operating problems with mismatched loads or transducers because power reflected by the load or transducer is again reflected by the preferred embodiment of the megasonic generator output stage back to the load or transducer. This results in a higher efficiency system when the transducer becomes mismatched due to temperature, age or other changes. The particular output stage 100 shown in FIG. 10 has an equivalent impedance of near infinity at the frequency of operation. Transmission line theory says this impedance will reflect back to the transducer all of the energy that was reflected by a mismatch between the coax cable and the transducer or matching network. This no loss reflecting system quickly reaches a steady state (about three microseconds for a typical megasonic system of the preferred embodiment) and the power leaving the generator equals the power used by the megasonic transducer assembly, which is the optimum condition and it is not dependent on cable length or impedance match.

Figure 11:
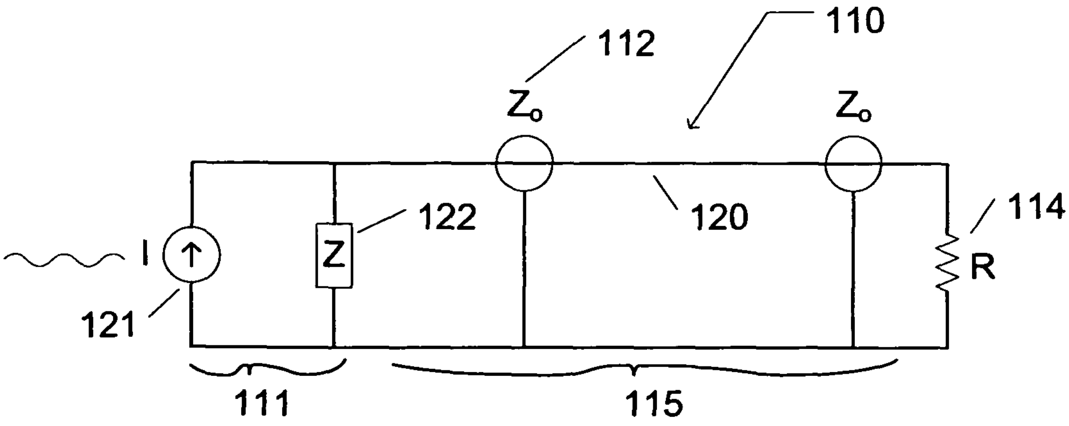
FIG. 11 shows the Norton equivalent circuit, the transmission line, and the equivalent circuit of a matching network and ultrasound transducer assembly for achievement of steady state operation using the output circuit of FIG. 10.

FIG. 11 shows a schematic diagram containing the Norton equivalent circuit 111 of the megasonic generator output from circuit 31 and network 32, the transmission line 115 with impedance Zo 112, and an equivalent representation of a transducer assembly 33 load 114. Norton equivalent circuit 111 consists of current source 121 and parallel impedance 122, which is near infinity according to this embodiment and when designed to the formula associated with FIG. 10.

With reference to FIG. 12, in another embodiment ultrasound generator 9 contains or is coupled to a system 7 that includes processor 4, non-volatile memory 5 and a sensor 3. Processor 4 is programmed to receive a signal from at least one sensor 3 during operation of the generator and to store the faults, errors or failures of the signal(s) in non-volatile memory 5. This history of faults, errors and failures is available to be downloaded from the generator 9 at a later date, including after power has been disconnected from the generator. This is a advantage over prior art ultrasound generators, especially to service persons. When an ultrasound generator is returned to the shop for troubleshooting and repair, often the service person finds nothing wrong with the generator and he is unable to duplicate the problem experienced by the end user. With a faults, errors and failures history available within the non-volatile memory of the generator, the service person can read out the faults, errors or failures experienced by the end user.

In this embodiment, sensor 3 is a conventional temperature sensor that responds to an over temperature condition within the generator, processor 4 is a conventional PIC, and memory 5 is conventional EEPROM. The temperature sensor manufactured by Analog Devices and the PIC and EEPROM manufactured by Microchip may be used in the preferred embodiment.

While a temperature sensor, PIC and EEPROM are used in the preferred embodiment, it is contemplated that other sensors, processors or memory may be used. For example, it is contemplated that a digital integrated circuit, microprocessor, microcontroller, CPU, PLC, PC or microcomputer may be used as a processor. In addition, it is contemplated that a magnetic memory, flash memory or optically memory may be used as the memory element. In addition, it is contemplated that other sensors or an array of sensors may be used to sense a fault, error or failure. For example, sensors may be employed or adapted to determine a low power line voltage condition, a high power line current draw, an over voltage power line condition, an over temperature condition, an over voltage ultrasound driving signal, an over current ultrasound driving signal, an under voltage ultrasound driving signal, an under current ultrasound driving signal, an unlocked PLL condition, an out of specification phase shift condition, an ultrasound drive frequency over maximum limit, an ultrasound drive frequency under a minimum limit, an excessive reflected power condition, an open ultrasound transducer assembly, a shortened ultrasound transducer assembly, an ultrasound transducer assembly over a maximum capacitance value, an ultrasound transducer assembly under a minimum capacitance value, a high impedance ultrasound transducer assembly, a low impedance ultrasound transducer assembly, a missing interlock, incorrect output power, loss of closed loop output power control, a start up sequence error, an aborted start up sequence, or a shut down sequence error. Thus, system 7 may be used to determine and record the history of numerous different faults, errors and failures of interest with respect to troubleshooting and repair of the generator or system.

The invention may be embodied in other specific forms without departing from its spirit or essential characteristics. The present embodiments are therefore to be considered as illustrative and not restrictive, the scope of the invention being indicated by the appended claims rather than by the foregoing description, and all changes which come within the meaning and range of the equivalency of the claims are therefore intended to be embraced therein. Accordingly, while the presently-preferred form of the system has been shown and described, and several embodiments discussed, persons skilled in this art will readily appreciate that various additional changes and modifications may be made without departing from the spirit of the invention, as defined and differentiated by the following claims.

What is claimed is:

1. An ultrasound system comprising:

a generator for generating a driving signal to power an ultrasound transducer assembly;

at least one sensor adapted to sense operating conditions of said generator;

a processor communicating with said sensor;

non-volatile memory coupled to said processor; and said processor programmed to receive a signal from said sensor during operation of said generator and to store said signal in said memory for access after operation of said generator when said signal indicates a system error, fault or failure;

whereby a history of said faults, errors or failures is available after said generator is powered down.

2. An ultrasound system according to claim 1, wherein said processor is selected from a group consisting of digital integrated circuits, programmable logic controllers or computers commonly referred to as microprocessors, microcontrollers, CPUs, PICs, PLCs, PCs and microcomputers.

3. An ultrasound system according to claim 1, wherein said non-volatile memory is selected from a group consisting of flash memory, EEPROM, magnetic memory and optical memory.

4. An ultrasound system according to claim 1, wherein said ultrasound system is operable at a phase lock loop frequency.

5. An ultrasound system according to claim 1, wherein said ultrasound transducer assembly is configured and arranged to couple megasonics to liquid, to couple ultrasonics to liquid, to couple ultrasonics to solid, or to couple ultrasonics to a gas.

6. An ultrasound system according to claim 1, wherein said non-volatile memory is RAM powered by a battery.

7. An ultrasound system according to claim 1, wherein said fault, error or failure is selected from a group consisting of a low power line voltage condition, a high power line current draw, an over voltage power line condition, an over temperature condition, an over voltage ultrasound driving signal, an over current ultrasound driving signal, an under voltage ultrasound driving signal, an under current ultrasound driving signal, an unlocked PLL condition, an out of specification phase shift condition, an ultrasound drive frequency over a maximum limit, an ultrasound drive frequency under a minimum limit, an excessive reflected power condition, an open ultrasound transducer assembly, a shorted ultrasound transducer assembly, an ultrasound transducer assembly over a maximum capacitance value, an ultrasound transducer assembly under a minimum capacitance value, a high impedance ultrasound transducer assembly, a low impedance ultrasound transducer assembly, a missing interlock, incorrect output power, loss of closed loop output power control, a start up sequence error, an aborted start up sequence, and a shut down sequence error.

8. An ultrasound system comprising:

an electronic bridge circuit that provides an operational ultrasound frequency or operational bandwidth of frequencies and has a first output terminal and a second output terminal configured to provide an output voltage and an output current;

a phase shift network having a first input terminal, a second input terminal, a first output terminal and a second output terminal;

said first output terminal of said electronic bridge circuit coupled to said first input terminal of said phase shift network and said second output terminal of said electronic bridge circuit coupled to said second input terminal of said phase shift network;

an ultrasound transducer having a first input terminal and a second input terminal, said first output terminal of said phase shift network coupled to said first input terminal of said ultrasound transducer and said second output terminal of said phase shift network coupled to said second input terminal of said ultrasound transducer;

at least one sensor adapted to sense operating conditions of said ultrasound system;

a processor communicating with said sensor;

non-volatile memory coupled to said processor;

said electronic bridge circuit, said phase shift network and said ultrasound transducer configured such that said output voltage leads said output current by an angle that is greater than 0 degrees and less than about 90 degrees for said operational ultrasound frequency or bandwidth of frequencies; and said processor programmed to receive a signal from said sensor during operation of said ultrasound system and to store said signal in said memory for access after operation of said ultrasound system when said signal indicates a system error, fault or failure;

whereby a history of said faults, errors or failures is available after said ultrasound system is powered down.

9. An ultrasound system according to claim 8, wherein said electronic bridge circuit comprises:

a loop inductance of between about 3 nanohenrys and about 27 nanohenrys; and at least one gate drive dead time of between about 97 nanoseconds and about 787 nanoseconds.

10. An ultrasound system according to claim 8, wherein said electronic bridge circuit comprises at least one power MOSFET transistor as a switching device.

11. An ultrasound system according to claim 8, wherein said output voltage leads said output current by an angle that varies as a function g(f) of the frequency over said operational bandwidth of frequencies to produce a specified function h(f) for power versus frequency over said operational bandwidth of frequencies.

12. An ultrasound system according to claim 8, wherein said processor is selected from a group consisting of digital integrated circuits, programmable logic controllers, microprocessors, microcontrollers, CPUs, PICs, PLCs, PCs and microcomputers.

13. An ultrasound system according to claim 8, wherein said non-volatile memory is selected from a group consisting of flash memory, EEPROM, magnetic memory and optical memory.

14. An ultrasound system according to claim 8, wherein said fault, error or failure is selected from a group consisting of a low power line voltage condition, a high power line current draw, an over voltage power line condition, an over temperature condition, an over voltage ultrasound driving signal, an over current ultrasound driving signal, an under voltage ultrasound driving signal, an under current ultrasound driving signal, an unlocked PLL condition, an out of specification phase shift condition, an ultrasound drive frequency over a maximum limit, an ultrasound drive frequency under a minimum limit, an excessive reflected power condition, an open ultrasound transducer assembly, a shorted ultrasound transducer assembly, an ultrasound transducer assembly over a maximum capacitance value, an ultrasound transducer assembly under a minimum capacitance value, a high impedance ultrasound transducer assembly, a low impedance ultrasound transducer assembly, a missing interlock, incorrect output power, loss of closed loop output power control, a start up sequence error, an aborted start up sequence, and a shut down sequence error.

* * * * *